United States Patent
Kataoka et al.

(10) Patent No.: US 9,815,133 B2
(45) Date of Patent: Nov. 14, 2017

(54) METHOD FOR PRODUCING A MODULE

(71) Applicant: CANON KABUSHIKI KAISHA, Tokyo (JP)

(72) Inventors: Ichiro Kataoka, Kawasaki (JP); Hiroshi Kondo, Yokohama (JP); Tadashi Kosaka, Atsugi (JP); Koji Tsuduki, Kawasaki (JP); Hisatane Komori, Ayase (JP); Shin Hasegawa, Hadano (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/817,013

(22) Filed: Aug. 3, 2015

(65) Prior Publication Data
US 2016/0044796 A1 Feb. 11, 2016

(30) Foreign Application Priority Data
Aug. 5, 2014 (JP) ................ 2014-159755

(51) Int. Cl.
*B23K 31/00* (2006.01)
*B23K 31/02* (2006.01)
*B23K 1/00* (2006.01)
*H05K 3/34* (2006.01)
*H05K 1/11* (2006.01)

(52) U.S. Cl.
CPC ......... *B23K 1/0016* (2013.01); *H05K 3/3436* (2013.01); *H01L 2224/48091* (2013.01); *H01L 2924/16195* (2013.01); *H05K 1/111* (2013.01); *H05K 3/3452* (2013.01); *H05K 2201/099* (2013.01); *H05K 2201/09663* (2013.01); *Y02P 70/613* (2015.11)

(58) Field of Classification Search
CPC ... H01L 24/11; B23K 1/0016; B23K 2201/36; B23K 2201/40; B23K 2201/42; B23K 35/025
USPC ...... 228/120, 121, 122.1, 123.1, 176, 180.1; 257/E23.021, 737, E21.508
See application file for complete search history.

(56) References Cited

U.S. PATENT DOCUMENTS

2009/0115050 A1* 5/2009 Kasuya ............... H01L 23/3677
257/701
2012/0106116 A1* 5/2012 Nakagawa ........ H01L 23/49838
361/808

FOREIGN PATENT DOCUMENTS

JP 3-284895 A 12/1991
JP 8-46343 A 2/1996
(Continued)

*Primary Examiner* — Erin Saad
(74) *Attorney, Agent, or Firm* — Canon U.S.A. Inc., IP Division

(57) ABSTRACT

A method includes applying solder pastes separately to first and second portions of the first member; bringing the solder paste applied to the first portion of the first member and a first portion of the second member into contact with each other, and bringing the solder paste applied to the second portion of the first member and a second portion of the second member into contact with other; and causing the solder paste brought into contact with the first portion of the second member and the solder paste brought into contact with the second portion of the second member to melt. In the melting, molten solder formed by melting the solder paste brought into contact with the first portion of the second member and molten solder formed by melting the solder paste brought into contact with the second portion of the second member are joined to each other.

20 Claims, 6 Drawing Sheets

(56) References Cited

FOREIGN PATENT DOCUMENTS

| | | |
|---|---|---|
| JP | 8-007655 B | 3/1996 |
| JP | 8-78824 A | 3/1996 |
| JP | 2002-290021 A | 10/2002 |
| JP | 2005-64206 A | 3/2005 |
| JP | 2005-210022 A | 8/2005 |
| JP | 2005-294632 A | 10/2005 |
| JP | 2006-287060 A | 10/2006 |
| JP | 2008-103547 A | 5/2008 |
| JP | 2008-288484 A | 11/2008 |
| JP | 2009-224697 A | 10/2009 |
| JP | 2012-94712 A | 5/2012 |
| JP | 4985708 B | 5/2012 |
| JP | 2012-209408 A | 10/2012 |

\* cited by examiner

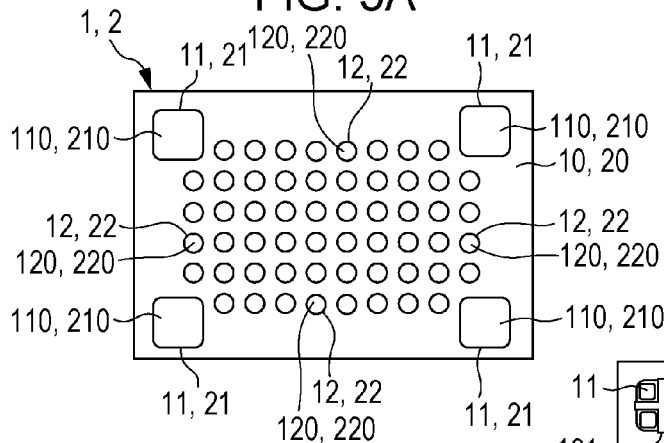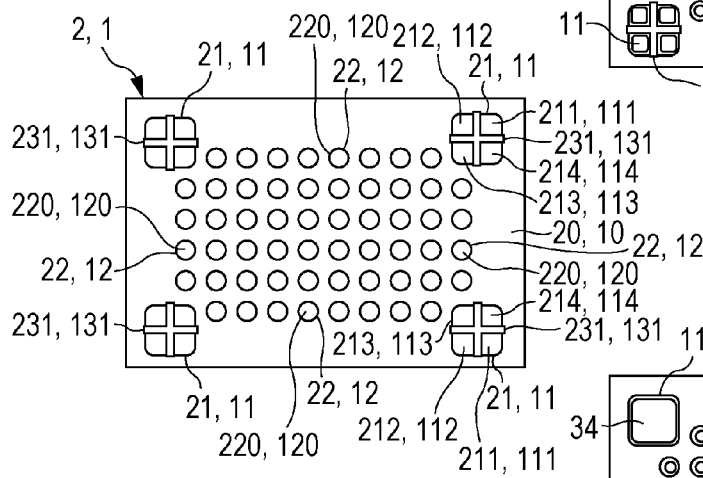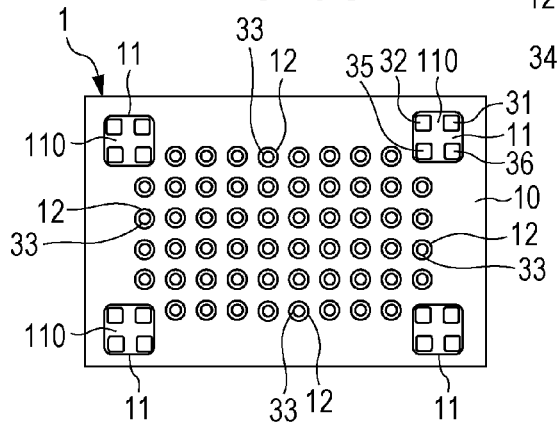

METHOD FOR PRODUCING A MODULE

BACKGROUND OF THE INVENTION

Field of the Invention

The present technology relates to a method for producing a module including a plurality of members soldered to each other.

Description of the Related Art

Japanese Patent Laid-Open No. 2012-94712 (Patent Literature 1 (PTL 1)) discloses that a solder non-adhesion region is provided in a land of an electronic component when the electronic component is mounted on a substrate by soldering the electronic component to the substrate.

In the technology disclosed in PTL 1, soldering joining strength with respect to a substrate land is not sufficient, as a result of which a problem in soldering reliability may occur. The present technology provides a method for producing a module capable of increasing soldering joining strength.

SUMMARY OF THE INVENTION

A method for producing a module including a first member and a second member that are soldered to each other includes an applying step of applying solder pastes to a first portion and a second portion of the first member; a contacting step of bringing the solder paste applied to the first portion of the first member and a first portion of the second member into contact with each other, and bringing the solder paste applied to the second portion of the first member and a second portion of the second member into contact with other; and a melting step of causing the solder paste brought into contact with the first portion of the second member and the solder paste brought into contact with the second portion of the second member to melt. The first portion of the first member and the second portion of the first member are included in a single land, and the first portion of the second member and the second portion of the second member are included in different lands. Alternatively, the first portion of the first member and the second portion of the first member are included in different lands, and the first portion of the second member and the second portion of the second member are included in a single land. In the applying step, the solder paste applied to the first portion of the first member and the solder paste applied to the second portion of the first member are separated from each other. In the melting step, molten solder formed by melting the solder paste brought into contact with the first portion of the second member and molten solder formed by melting the solder paste brought into contact with the second portion of the second member are brought into contact with each other.

Further features of the present invention will become apparent from the following description of exemplary embodiments with reference to the attached drawings.

BRIEF DESCRIPTION OF THE DRAWINGS

FIGS. 5A to 5E are schematic sectional views for describing methods for producing modules.

DESCRIPTION OF THE EMBODIMENTS

Figure 1:
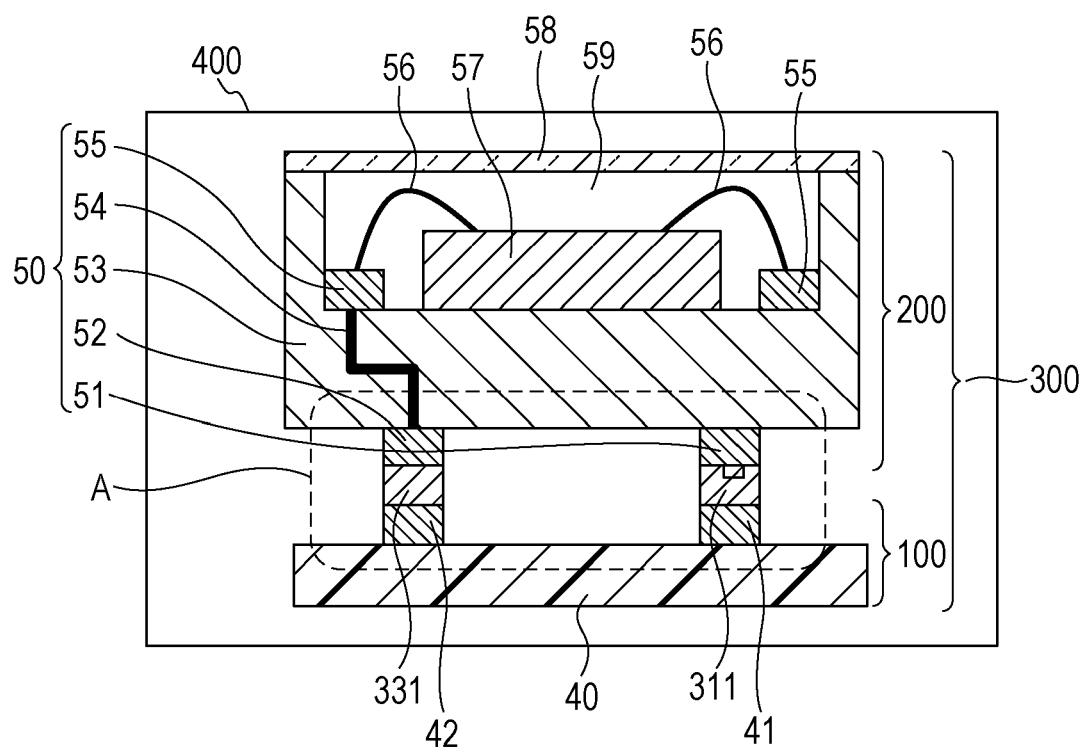
FIG. 1 is a schematic sectional view of an electronic apparatus.

Embodiments for implementing the present technology are hereunder described with reference to the drawings. In the descriptions and drawings below, common structural portions in a plurality of figures are given the same reference numerals. The common structural portions are described by referring to a plurality of figures. The common structural portions are not described where appropriate.

FIG. 1 is a schematic sectional view of an electronic apparatus 500 according to an embodiment. The electronic apparatus 500 includes a module 300 and a housing 400 that accommodates the module 300. The electronic apparatus 500 is an information apparatus, such as a smartphone, a display apparatus, such as a television, or an image pickup apparatus, such as a camera. The module 300 includes a module board 100 and an electronic component 200 that is soldered to the module board 100 with solder 311 and solder 331. The module 300 may include, for example, as a camera module, a lens unit.

The module board 100 is, for example, a printed wiring board that uses a base substrate 40, such as a flexible substrate or a rigid substrate. Connection portions 41 and 42 that are soldered to the electronic component 200 are provided on a surface of the base substrate 40. The base substrate 40 is formed of, for example, a material containing organic resin, such as a glass epoxy resin or a glass polyimide resin composite material. The connection portions 41 and 42, which are provided on the surface of the base substrate 40, are each formed of a metal, such as copper, gold, aluminum, nickel, solder, or tungsten.

The electronic component 200 includes a package 50, an electronic device 57 electrically connected to the package 50 by connection members 56, and a sealing member 58 that seals the electronic device 57.

The package 50 includes outer connection portions 51 and 52, a base substrate 53, an internal wire 54, and inner connection portions 55. The base substrate 53 is formed of, for example, resin, ceramic, or a metal. The outer connection portions 51 and 52 are provided so as to be exposed at an outer surface of the base substrate 53. The outer connection portion 52 is electrically connected to the inner connection portion 55 through the internal wire 54. The outer connection portion 51 is capable of functioning as a reinforcing connection portion. Therefore, although the outer connection portion 51 may also be electrically connected to the other inner connection portion 55, the outer connection portion 51 need not be electrically connected to the other inner connection portion 55. In order to increase the connection strength of the outer connection portion 51, the area of the outer connection portion 51 may be made larger than the area of the outer connection portion 52. A land grid array (LGA) type in which the outer connection portions 51 and 52 are disposed on a lower surface (back surface) of the base substrate 53 is an example of a type of arrangement of the outer connection portions 51 and 52. A leadless chip carrier (LCC) type in which the outer connection portions 51 and 52 are disposed from side surfaces to the lower surface of the base substrate 53 is another example of a type of arrangement of the outer connection portions 51 and 52. The inner connection portions 55 are provided on a top surface (front surface) of the base substrate 53. Although FIG. 1 schematically shows one outer connection portion 51 and one outer connection portion 52, a plurality of the outer connection portions 51 and a plurality of the outer connection portions 52 may be provided.

The inner connection portions 55 are each connected to the electronic device 57 through the corresponding connection member 56. The connection members 56 are bonding wires used in wire bonding connection, or solder bumps used in flip chip connection. The electronic device 57 is secured to the top surface of the base substrate 53 with an adhesive (not shown). The electronic device 57 is typically a semiconductor device, and is a computing device or a storage device, a display device or an image pickup device, or a micro-electromechanical system (MEMS) device. A CCD image sensor and a CMOS image sensor are typical examples of the image pickup device. In the case of the image pickup device, in general, as shown in FIG. 1, a hollow structure including a space 59 between the electronic device 57 and the sealing member 58 is provided by using a plate-shaped cover as the sealing member 58.

The connection portion 41 and the outer connection portion 51 are soldered to each other with the solder 311. The connection portion 42 and the outer connection portion 52 are soldered to each other with the solder 331. Although the solder 311 and the solder 331 are typically a tin alloy and their compositions are not particularly limited to certain compositions, it is desirable that the solder 311 and the solder 331 be lead-free from the viewpoint of environments.

Methods for producing the module 300 according to a first embodiment, a second embodiment, and a reference form are described below.

First Embodiment

With reference to FIGS. 2A to 2E and FIGS. 5A to 5C, a method for producing a module according to the first embodiment is described. FIGS. 2A to 2E are each an enlarged view of a portion surrounded by a dotted line A in FIG. 1.

Figure 2A:
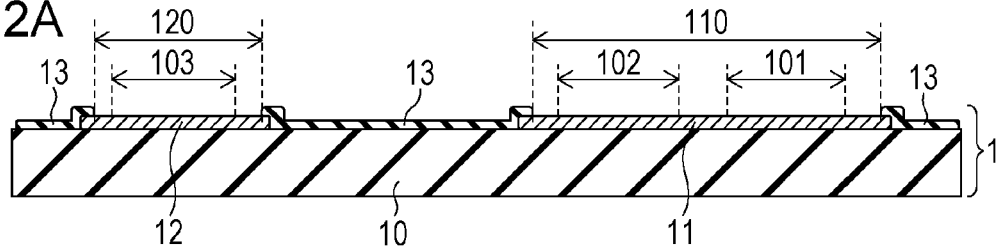
FIGS. 2A to 2E are schematic sectional views for describing a method for producing a module.

FIG. 2A illustrates Step a for providing a first member 1. The first member 1 corresponds to, for example, one of the above-described module board 100 and electronic component 200. The first member 1 includes an insulating base substrate 10, electrically conductive films 11 and 12 on the base substrate 10, and an insulating film 13 on the base substrate 10. If the first member 1 is, for example, the above-described module board 100, the base substrate 10 corresponds to the base substrate 40 shown in FIG. 1, the electrically conductive film 11 corresponds to the connection portion 41 shown in FIG. 1, and the electrically conductive film 12 corresponds to the connection portion 42 shown in FIG. 1. If the first member 1 is, for example, the above-described electronic component 200, the base substrate 10 corresponds to the base substrate 53 shown in FIG. 1, the electrically conductive film 11 corresponds to the outer connection portion 51 shown in FIG. 1, and the electrically conductive film 12 corresponds to the outer connection portion 52 shown in FIG. 1.

The electrically conductive film 11 includes a land 110, and the electrically conductive film 12 includes a land 120. The lands 110 and 120 are regions where solder joints can be formed. In the embodiment, the insulating film 13 has openings above the electrically conductive films 11 and 12. A region of a surface of the electrically conductive film 11 that is exposed at the opening in the insulating film 13 corresponds to the land 110. A region of a surface of the electrically conductive film 12 that is exposed at the opening in the insulating film 13 corresponds to the land 120. Therefore, inner edges of the openings in the insulating film 13 define outer edges of the corresponding lands. Instead of defining the lands by the insulating film 13, it is possible to define the lands only on the basis of whether or not the electrically conductive films 11 and 12 exist on the base substrate 10 without providing the insulating film 13. In this case, the entire surfaces of the electrically conductive films 11 and 12 can become the lands, and the outer edges of the electrically conductive films 11 and 12 define the outer edges of the corresponding lands. A portion of the land 110 is a first portion 101, and a different portion of the land 110 is a second portion 102. A portion of the land 120 is a third portion 103. The first portion 101 and the second portion 102 are each a portion of the surface of the single electrically conductive film 11 and are included in the single land 110. That is, regions where soldering can be performed are continuously formed between the first portion 101 and the second portion 102. The third portion 103 is a portion of the surface of the electrically conductive film 12, which differs from the electrically conductive film 11 including the first portion 101 and the second portion 102. The third portion 103 is included in the land 120 that differs from the land 110 including the first portion 101 and the second portion 102. Although, in the first embodiment, the area of the land 120 including the third portion 103 is smaller than the area of the single land including the first portion 101 and the second portion 102, the area of the land 120 may be larger than or equal to the area of the land 110.

FIG. 5A shows an example of a layout of a surface (joining surface) where lands of the first member 1 according to the first embodiment are provided. A total of four electrically conductive films 11 are arranged near four corners of the joining surface of the base substrate 10. The four electrically conductive films 11 each include a signal land 110. A plurality of electrically conductive films 12 are arranged in a lattice on the joining surface of the base substrate 10. The plurality of electrically conductive films 12 each include a single land 120. The area of each single electrically conductive film 11 is larger than the area of each single electrically conductive film 12. The area of each single land 110 is larger than the area of each single land 120. The area of each single land 110 may be larger than or equal to ⅔ of the area of each electrically conductive film 11 where the corresponding land 110 is provided. The area of each single land 120 may be larger than or equal to ⅔ of the area of each electrically conductive film 12 where the corresponding land 120 is provided.

Figure 2B:
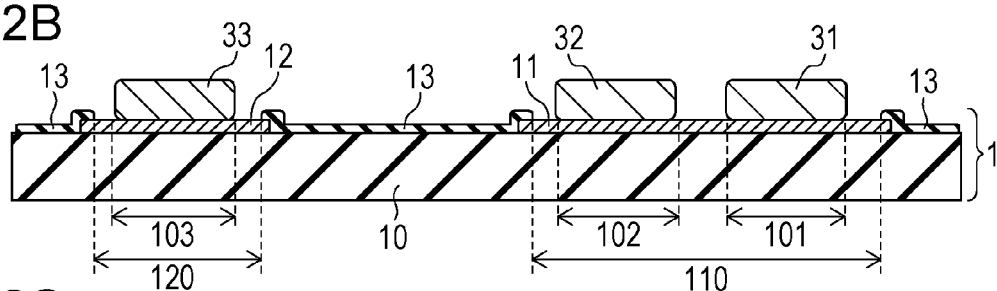

FIG. 2B illustrates Step b for applying solder pastes 31, 32, and 33 to the first member 1. The solder pastes 31, 32, and 33 may be applied by screen printing or a dispensing method. In Step b, the solder paste 31 is applied to the first portion 101, the solder paste 32 is applied to the second portion 102, and the solder paste 33 is applied to the third portion 103. That is, the solder paste 31 and the solder paste 32 are applied so as to be separated from each other to the single land 110. With the solder paste 31 and the solder paste 32 being separated from each other, the solder paste 33 is applied to the land 120, which differs from the land 110. It is desirable that the application of the solder paste 31 to the first portion 101, the application of the solder paste 32 to the second portion 102, and the application of the solder paste 33 to the third portion 103 be performed at the same time. However, for example, when compositions or application amounts of the solder pastes are different for different portions, the solder pastes may be applied to the different portions at different timings.

FIG. 5C shows an example of a layout of solder pastes on the layout of the surface (joining surface) where the lands of the first member 1 according to the first embodiment shown in FIG. 5A are provided. Solder pastes 31, 32, 35, and 36 are disposed on each single land 110 at the corresponding electrically conductive film 11.

Figure 2C:
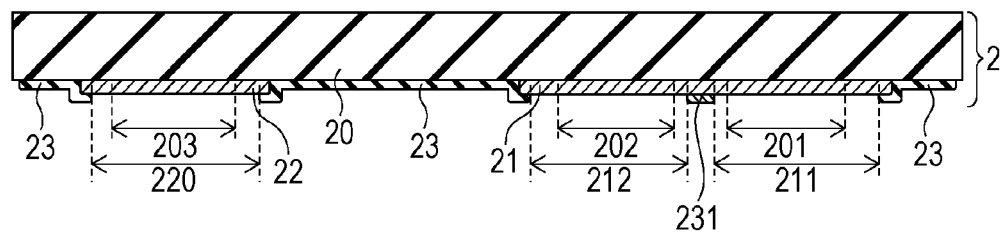

FIG. 2C illustrates Step c for providing a second member 2. The second member 2 corresponds to, for example, the other of the above-described module board 100 and electronic component 200. That is, if the first member 1 is the module board 100, the second member 2 is the electronic component; whereas, if the first member 1 is the electronic component 200, the second member 2 is the module board 100. The second member 2 includes an insulating base substrate 20, electrically conductive films 21 and 22 on the base substrate 20, and an insulating film 23 on the base substrate 20. If the second member 2 is, for example, the above-described electronic component 200, the base substrate 20 corresponds to the base substrate 53 shown in FIG. 1, the electrically conductive film 21 corresponds to the outer connection portion 51 shown in FIG. 1, and the electrically conductive film 22 corresponds to the outer connection portion 52 shown in FIG. 1. If the second member 2 is, for example, the above-described module board 100, the base substrate 20 corresponds to the base substrate 40 shown in FIG. 1, the electrically conductive film 21 corresponds to the connection portion 41 shown in FIG. 1, and the electrically conductive film 22 corresponds to the connection portion 42 shown in FIG. 1.

The electrically conductive film 21 includes lands 211 and 212, and the electrically conductive film 22 includes a land 220. The lands 211, 212, and 220 are regions where solder joints can be formed. Regions of the lands 211, 212, and 220 where solder joints can be formed are not continuously formed. In the first embodiment, the insulating film 23 has openings above the electrically conductive films 21 and 22. A region of a surface of the electrically conductive film 21 that is exposed at the opening in the insulating film 23 corresponds to the land 211. A different region of the surface of the electrically conductive film 21 that is exposed at the opening in the insulating film 23 corresponds to the land 212. A region of a surface of the electrically conductive film 22 that is exposed at the opening in the insulating film 23 corresponds to the land 220. The lands 211 and 212 are included in the single electrically conductive film 21. The lands 211 and 212 are defined by a separation portion 231 that is part of the insulating film 23 that contacts the single electrically conductive film 21.

The insulating film 23 may be an inorganic material film containing a silicon compound (such as silicon oxide or silicon nitride) or a metal compound (such as aluminum oxide (alumina) or aluminum nitride). Alternatively, the insulating film 23 may be an organic material film containing epoxy resin, acrylic resin, polyimide resin, or the like, capable of being used as a solder resist.

Instead of defining the lands by the insulating film 23, it is possible to define the lands on the basis of whether or not the electrically conductive films 21 and 22 exist on the base substrate 20 without providing the insulating film 23. In this case, the entire surfaces of the electrically conductive films 21 and 22 become the lands. A portion of a land 210 is a first portion 201, and a different portion of the land 210 is a second portion 202. A portion of the land 220 is a third portion 203. The first portion 201 and the second portion 202 are each a portion of the surface of the single electrically conductive film 21 and are included in the single land 210. The third portion 203 is a portion of the surface of the electrically conductive film 22, which differs from the electrically conductive film 21 including the first portion 201 and the second portion 202. The third portion 203 is included in the land 220, which differs from the land 210 including the first portion 201 and the second portion 202. Although, in the first embodiment, the area of the land 220 including the third portion 203 is smaller than the area of the single land 110 including the first portion 101 and the second portion 102, the area of the land 220 may be larger than or equal to the area of the land 110.

FIG. 5B shows an example of a layout of a surface (joining surface) where lands of the second member 2 according to the first embodiment are provided. A total of four electrically conductive films 21 are arranged near four corners of the joining surface of the base substrate 20. Separation portions 231 that are formed from an insulating film that contacts the electrically conductive films 21 are provided on the four electrically conductive films 21. The separation portions 231 are cross-shaped. The four electrically conductive films 21 each include four lands 211, 212, 213, and 214. The separation portions 231 are formed from an insulating film that contacts the electrically conductive films 21. The insulating film covers portions between the electrically conductive films 21 and 22 in addition to the electrically conductive films 21. However, these portions are not shown. A plurality of electrically conductive films 22 are arranged in a lattice on the joining surface of the base substrate 20. The plurality of electrically conductive films 22 each include the single land 220. The area of each single electrically conductive film 21 is larger than the area of each single electrically conductive film 22. The area of each of the single lands 211, 212, 213, and 214 is about the same as the area of each single land 220, or may be larger than or smaller than the area of each single land 220. The area of each of the single lands 211, 212, 213, and 214 may be smaller than or equal to ½ of the area of its corresponding electrically conductive film 21. The area of each single land 220 may be larger than or equal to ⅔ of the area of the electrically conductive film 22 where the corresponding land 220 is provided.

Figure 2D:
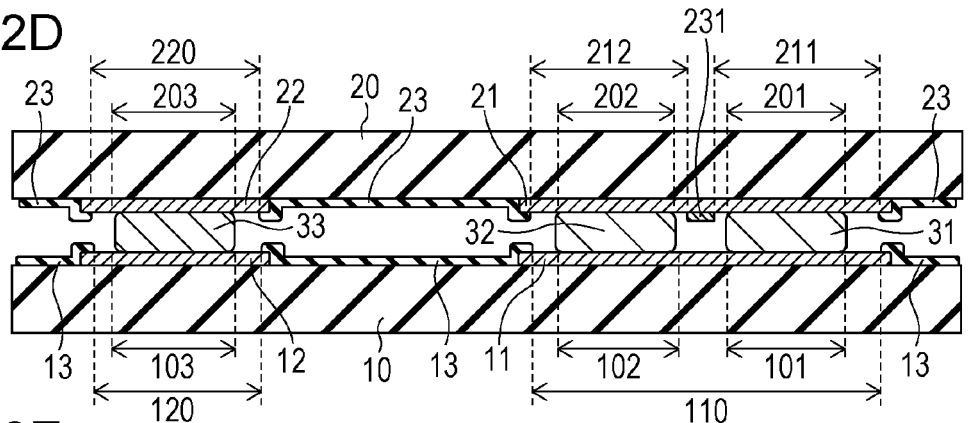

FIG. 2D illustrates Step d for bringing the solder pastes 31, 32, and 33 into contact with the second member 2. In Step d, the solder paste 31 applied to the first portion 101 of the first member 1 and the first portion 201 of the second member 2 are brought into contact with each other. In addition, in Step d, the solder paste 32 applied to the second portion 102 of the first member 1 and the second portion 202 of the second member 2 are brought into contact with each other. The solder pastes 31 and 32 are not be brought into contact with the separation portion 231. Further, in Step d, the solder paste 33 applied to the third portion 103 of the first member 1 and the third portion 203 of the second member 2 are brought into contact with each other.

Figure 2E:
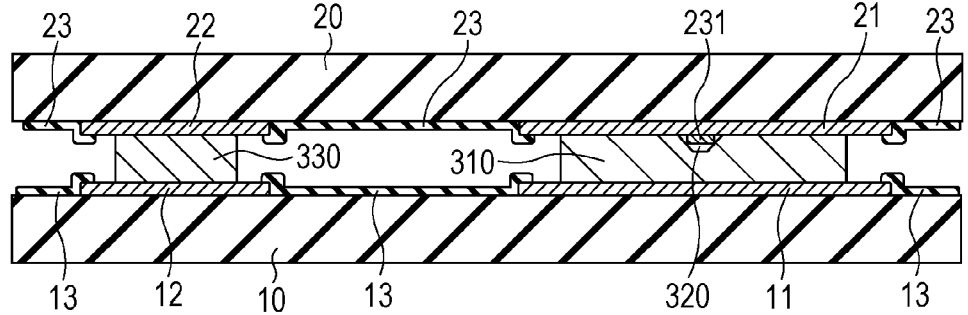

FIG. 2E illustrates Step e for melting the solder pastes 31, 32, and 33. The first member 1 and the second member 2 that have been superposed upon each other with the solder pastes 31, 32, and 33 being interposed therebetween are heated by using a heating furnace (reflow furnace) or a hot plate. The solder pastes 31, 32, and 33 are heated to a temperature that is higher than or equal to the melting point of granular solder included in each of the solder pastes 31, 32, and 33. The melting point of granular solder included in each of the solder pastes 31, 32, and 33 may be lower than or equal to 170° C.

In Step e, molten solder formed by the melting of the solder paste 31 and molten solder formed by the melting of the solder paste 32 are joined to each other, as a result of which an integrated molten solder 310 is formed. The molten solders are joined when the molten solder that has spread over the surface of the land 110 as a result of the melting of the solder paste 31 and the molten solder that has spread over the surface of the land 110 as a result of the melting of the solder paste 32 contact each other. In order to form the integrated molten solder 310, the solder pastes 31 and 32 may be applied so as to be separated from each other by a distance that allows the molten solder formed by the melting of the solder paste 31 and the molten solder formed by the melting of the solder paste 32 to contact each other when they spread over the surface of the land 110. More specifically, the sum of the distance that the molten solder formed by the melting of the solder paste 31 spreads over the surface of the land 110 and the distance that the molten solder formed by the melting of the solder paste 32 spreads over the surface of the land 110 may be larger than the distance between the solder paste 31 and the solder paste 32. Although it is not necessary to perform a special operation for joining the molten solders, it is possible to speed up the joining of the molten solders by, for example, applying vibration to at least one of the first member 1 and the second member 2.

A gap 320 is formed between the molten solder 310 and the separation portion 231. Through the gap 320 extending along the separation portion 231, gas that is generated when the solder pastes 31, 32, and 33 are heated can be exhausted. The gap 320 can be properly formed when, in Step d, the solder pastes 31 and 32 are not brought into contact with the separation portion 231. In Step e, molten solder 330 formed by the melting of the solder paste 33 is not joined to solder pastes that have contacted portions other than the third portion 203, such as the solder paste 31 brought into contact with the first portion 201 or the solder paste 32 brought into contact with the second portion 202.

Thereafter, by cooling the molten solder 310 and the molten solder 330, the molten solder 310 and the molten solder 330 are solidified, so that the solder 311 and the solder 331 shown in FIG. 1 are formed. Accordingly, the module 300 including the first member 1 and the second member 2 soldered to each other can be provided.

Second Embodiment

A method for producing a module according to a second embodiment is described with reference to FIGS. 3A to 3E and FIGS. 5A, 5B, and 5D. FIGS. 3A to 3E are enlarged views of a portion surrounded by the dotted line A in FIG. 1.

Since the second embodiment differs from the first embodiment only in the positions of separation portions, details of the second embodiment are not given below.

Figure 3A:
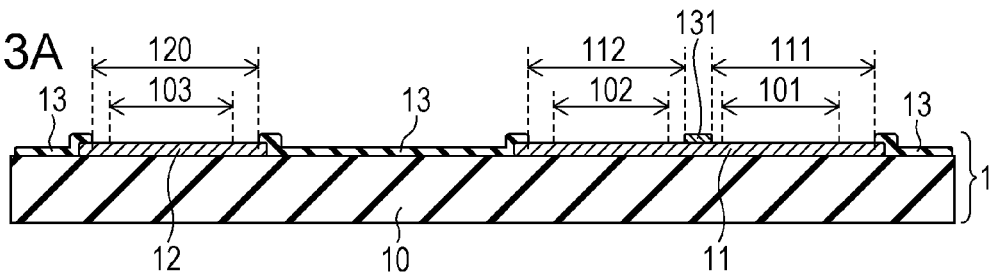
FIGS. 3A to 3E are schematic plan views of members that make up the module.

FIG. 3A illustrates Step a for providing a first member 1. In the first embodiment, the first portion 201 of each second member 2 and the second portion 202 of each second member 2 are included in different lands, that is, in the land 211 and the land 212, respectively. In contrast, the second embodiment differs from the first embodiment in that each first portion 101 of a first member 1 and each second portion 102 of the first member 1 are included in different lands, that is, in a land 111 and a land 112, respectively. In the first embodiment, each land 211 and each land 212 are defined by the corresponding separation portion 231 of the insulating film 23 (that contacts each electrically conductive film 21) in the second member 2. In contrast, the second embodiment differs from the first embodiment in that each land 111 and each land 112 are defined by a corresponding separation portion 131 of an insulating film 13 (that contacts each electrically conductive film 11) in the first member 1.

FIG. 5B shows an example of a layout of a surface (joining surface) where lands of the first member 1 according to the second embodiment are provided. The first member 1 is provided with four electrically conductive films 11 and a plurality of electrically conductive films 12 on a base substrate 10, the area of each electrically conductive film 12 being smaller than the area of each electrically conductive film 11. Separation portions 131 that are formed from an insulating film that contacts the electrically conductive films 11 are provided on the four electrically conductive films 11. The separation portions 131 are cross-shaped. The single electrically conductive films 11 each include four lands 111, 112, 113, and 114 that are separated from each other by the corresponding separation portion 131. The plurality of electrically conductive films 12 each include a single land 120. The separation portions 131 are formed from an insulating film that contacts the electrically conductive films 11. The insulating film covers portions between the electrically conductive films 11 and 12 in addition to the electrically conductive films 11. However, these portions are not shown.

Figure 3B:
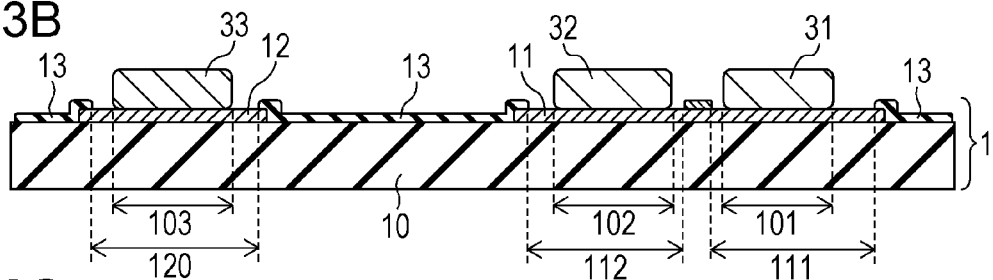

FIG. 3B illustrates Step b for applying solder pastes 31, 32, and 33 to the first member 1. The solder paste 31 is applied to the first portion 101, the solder paste 32 is applied to the second portion 102, and the solder paste 33 is applied to a third portion 103. The solder pastes 31 and 32 may be applied so as not to contact the separation portion 131.

FIG. 5D shows an example of a layout of solder pastes on the layout of the surface (joining surface) where the lands of the first member 1 according to the second embodiment shown in FIG. 5B are provided. Solder pastes 31, 32, 35, and 36 are disposed on each electrically conductive film 11. The separation portions 131 are positioned between the solder pastes 31, 32, 35, and 36.

Figure 3C:
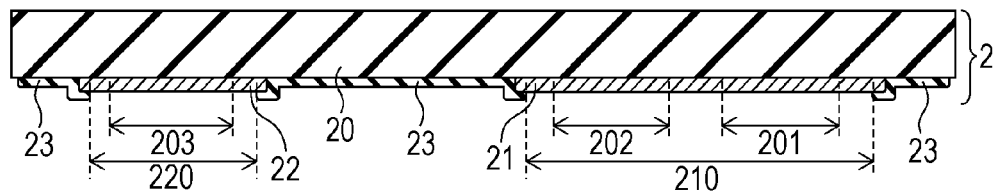

FIG. 3C illustrates Step c for providing a second member 2. In the first embodiment, each first portion 101 of the first member 1 and each second portion 102 of the first member 1 are included in the single land 110. In contrast, the second embodiment differs from the first embodiment in that each first portion 201 of the second member 2 and each second portion 202 of the second member 2 are included in a single land 210.

Figure 3D:
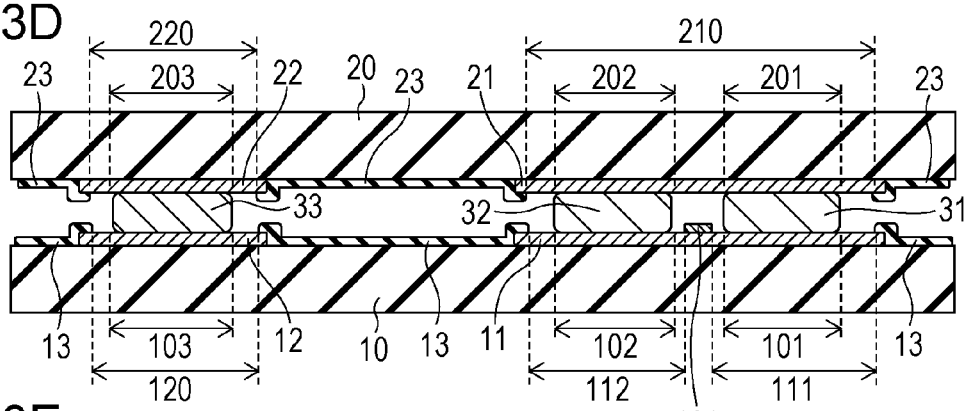

FIG. 3D illustrates Step d for bringing the solder pastes 31, 32, and 33 applied to the first member 1 into contact with the second member 2. The solder paste 31 is brought into contact with the second portion 201, the solder paste 32 is brought into contact with the second portion 202, and the solder paste 33 is brought into contact with a third portion 203.

Figure 3E:
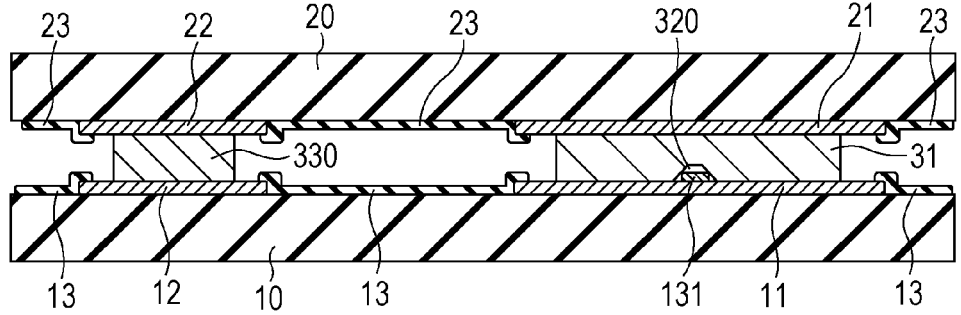

FIG. 3E illustrates Step e for melting the solder pastes 31, 32, and 33 brought into contact with the second member 2. As in the first embodiment, molten solder formed by the melting of the solder paste 31 and molten solder formed by the melting of the solder paste 32 are joined to each other, as a result of which an integrated molten solder 310 is formed. A gap 320 is formed between the molten solder 310 and the separation portion 131. The gap 320 can be properly formed when, in Step b, the solder pastes 31 and 32 are not brought into contact with the separation portion 131. The molten solder 330 does not contact another molten solder, such as the molten solder 310.

According to the first embodiment and the second embodiment described above, the solder pastes 31, 32, and 33 are applied to the first member 1. The first member 1 to which the solder pastes 31, 32, and 33 are applied may be the module board 100 or the electronic component 200. However, from the viewpoint of productivity, the module board 100 that is easier to handle than the electronic component 200 may be the first member 1, and the electronic component 200 that is generally smaller than the module board 100 may be the second member 2. That is, the solder pastes 31, 32, and 33 may be applied to the module board 100, and the applied solder pastes 31, 32, and 33 may be brought into contact with the electronic component 200.

Reference Form

A reference form of a method for producing a module is described with reference to FIGS. 4A to 4E. Since the reference form only differs from the first embodiment in the forms of application of solder pastes, details of the reference form are not given below.

Figure 4A:
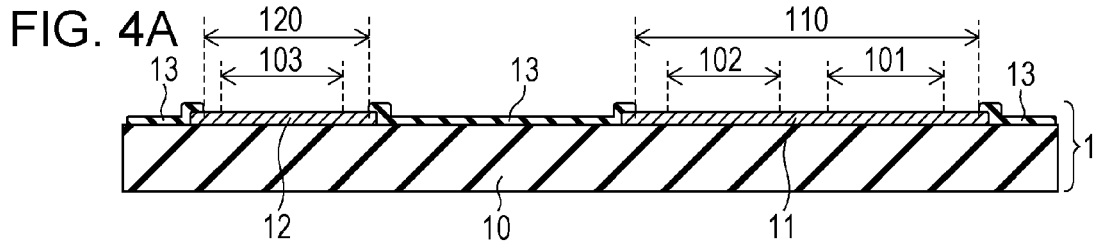
FIGS. 4A to 4E are schematic sectional views for describing a method for producing a module.

FIG. 4A illustrates Step a for providing a first member 1. As in the first embodiment, in the first member 1, a single electrically conductive film 11 includes a single land 110, and a first portion 101 and a second portion 102 are included in the single land 110.

Figure 4B:
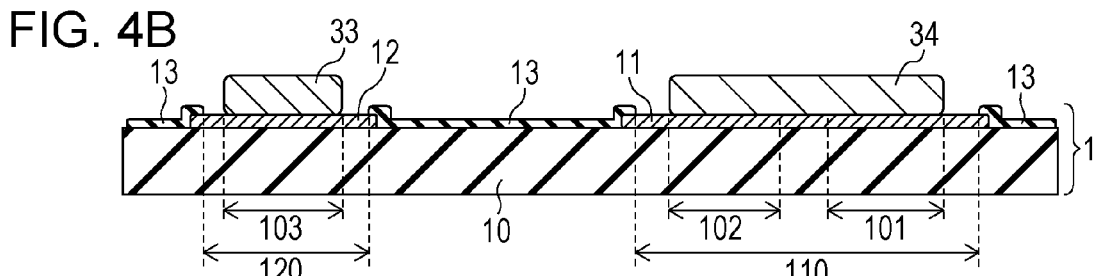

FIG. 4B illustrates Step b for applying solder pastes 33 and 34 to the first member 1. In the first embodiment, the solder pastes 31 and 32 are applied so as to be separated from each other. In contrast, in the reference form, the continuous solder paste 34 is applied to the first portion 101 and the second portion 102 included in the single land 110.

Figure 4C:
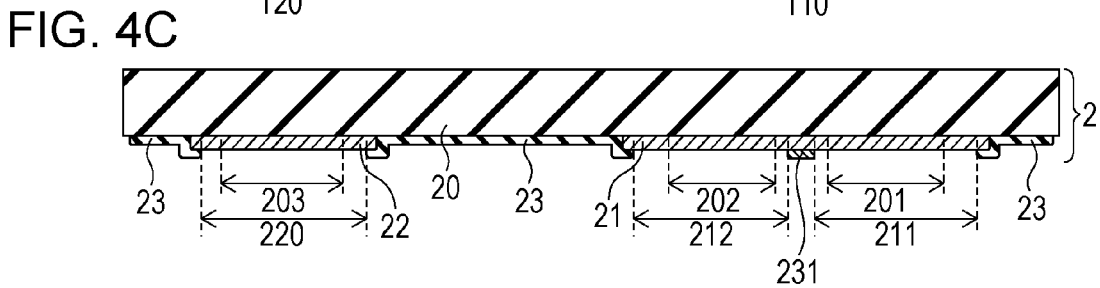

FIG. 4C illustrates Step c for providing a second member 2. As in the first embodiment, in the second member 2, a single electrically conductive film 21 includes separate lands 211 and 212 that are defined by a separation portion 231. A first portion 201 is included in the land 211 and a second portion 202 is included in the land 212.

Figure 4D:
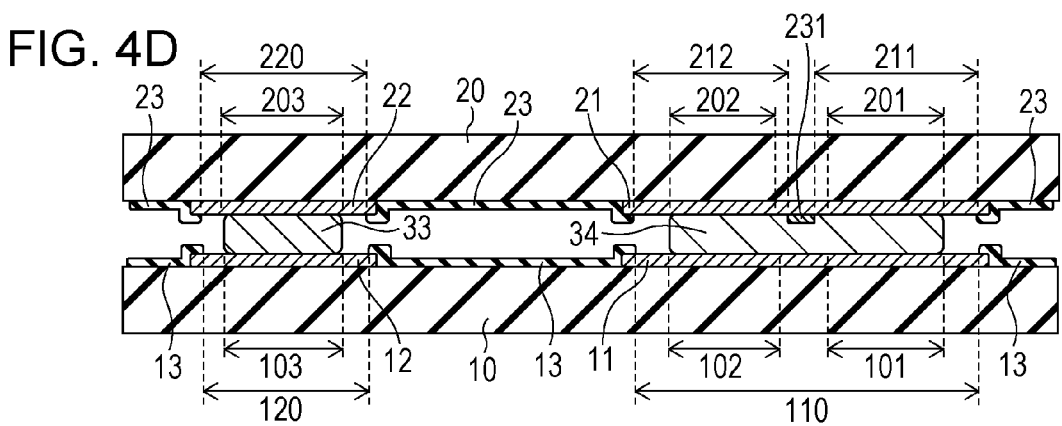

FIG. 4D illustrates Step d for bringing the solder pastes 33 and 34 applied to the first member 1 into contact with the second member 2. The solder paste 34 is brought into contact with both the first portion 201 and the second portion 202. The solder paste 34 also contacts the separation portion 231.

Figure 4E:
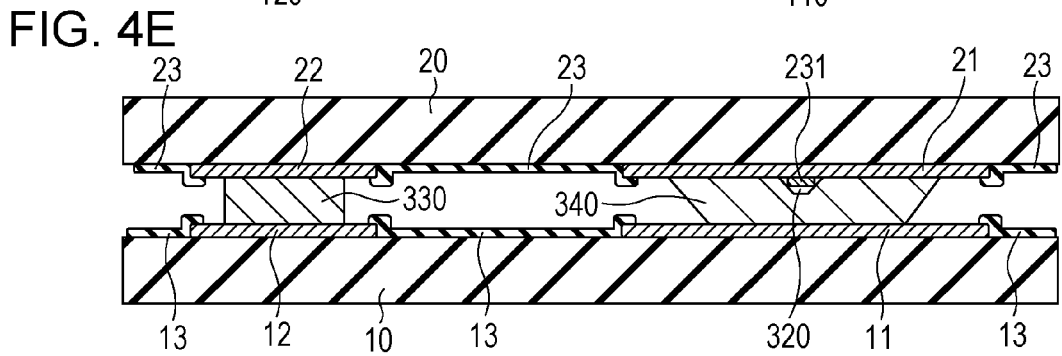

FIG. 4E illustrates Step e for melting the solder pastes 33 and 34 brought into contact with the second member 2. Molten solder 340 formed by the melting of the solder paste 34 does not contact another molten solder, such as molten solder 330 formed by the melting of the solder paste 33.

When the solder paste 34 is continuously applied to the first portion 101 and the second portion 102 of the single land 110 in this way, solder gathers at a center of the land when the solder paste is melted. As a result, as shown in FIG. 4E, it is less likely for the solder to spread to end portions of the single land 110.

On the other hand, when, as in the first embodiment, the solder pastes 31 and 32 are applied so as to be separated from each other to each single land 110, or, as in the second embodiment, the solder pastes 31 and 32 are disposed so as to be separated from each other and are brought into contact with each single land 210, the collection of solder at the center of each land when the solder pastes are melted is suppressed. In addition, this allows the solder to easily spread to the end portions of each land. As a result, in the first embodiment, it is possible for the solder to be formed over a wide range on each single land 110 and, thus, to increase joining strength. In addition, in the second embodiment, it is possible to provide the solder over a wide range on each single land 210, and, thus, to increase joining strength. Consequently, compared to the reference form, in the first and second embodiments, the area of the solder on each single land 110 is increased, so that the joining strength is increased. Since the wettability of low-melting-point solder whose melting point is lower than or equal to 170° C. is low with respect to a land whose surface is formed of, for example, gold or copper, when solder whose melting point is lower than or equal to 170° C. is used, the first and second embodiments are particularly effective.

In the first embodiment, a separation portion 231 is provided at each second member 2, which is not the first member 1 to which the solder pastes 31 and 32 are applied. In the second embodiment, a separation portion 131 is provided at each first member 1 to which the solder pastes 31 and 32 are applied. Moreover, when the solder pastes 31 and 32 are applied so as to be separated from each other and are joined to each other after they have been melted, separation portions need not be provided at either of the first member 1 and the second member 2. However, from the viewpoint of forming the gaps 320, it is desirable to form separation portions at either one of the first member 1 and the second member 2.

In the first embodiment, each separation portion 231 that separates the corresponding electrically conductive film 21 into the corresponding land 211 and the corresponding land 212 is an insulating film that contacts the corresponding electrically conductive film 21. Similarly, in the second embodiment, each separation portion 131 that separates the corresponding electrically conductive film 11 into the corresponding land 111 and the corresponding land 112 is an insulating film that contacts the corresponding electrically conductive film 11. It is possible to separate a land by providing a groove in an electrically conductive film 21 or an electrically conductive film 11 without using an insulating film. However, the use of an insulating film where the wettability of solder is low as each separation portion 231 or 131 suppresses the collection of solder at the center of each single land 110 or each single land 210. It is desirable that the shape of each of the separation portions 231 or 131 be substantially linear with respect to its corresponding land. This is because, when the shape of each separation portion is not substantially linear, joining of solders at separated lands becomes unstable depending upon locations.

It is desirable that the width of each separation portion 231 or the width of each separation portion 131 between lands, that is, the distance between each land 211 and its corresponding land 212 or the distance between each land 111 and its corresponding land 112 be from 0.5 times to 2.5 times the thickness of a solder layer after the solders are joined. If the width of each separation portion 231 or the width of each separation portion 131 is less than 0.5 times the thickness of a solder layer, the effect of providing each separation portion 231 or the effect of providing each separation portion 131 is considerably reduced. That is, molten solder tends to be collected at the center of each land, as a result of which the solder is less likely to spread to end portions of each land. On the other hand, if the width of each separation portion 231 or the width of each separation portion 131 is larger than 2.5 times the thickness of a solder layer, molten solders are less likely to join with each other at the center of each land when solders are melted, as a result of which the soldering joining strength of may be reduced.

Figure 6A:
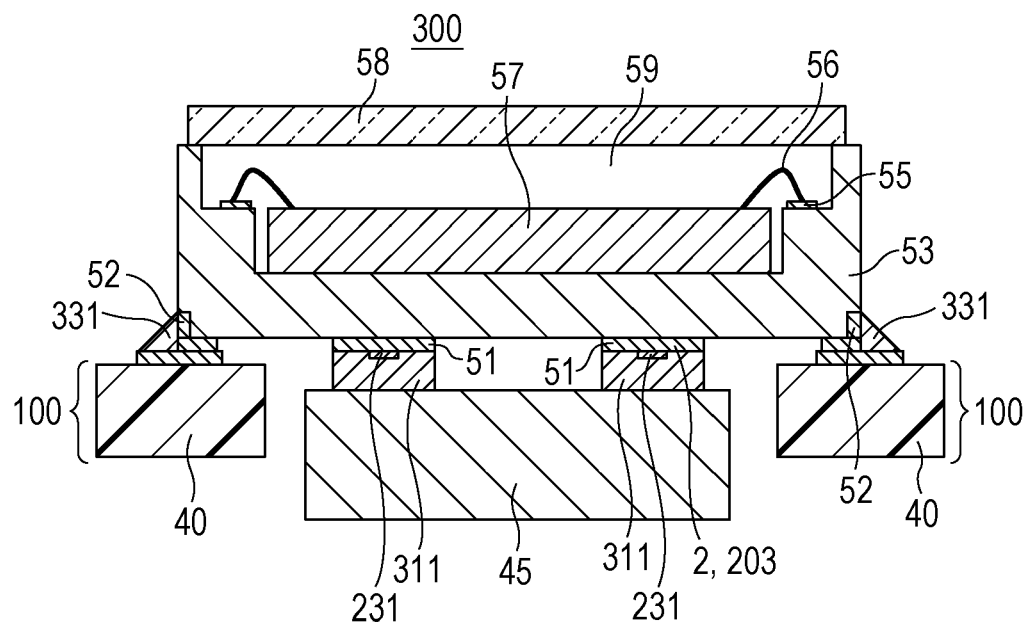
FIGS. 6A and 6B are schematic sectional views for describing a method for producing a module.

In the above-described first and second embodiments, the combining of the first member 1 and the second member 2 is not limited to the connection between the module board 100 and the electronic component 200. FIG. 6A illustrates an example in which a leadless chip carrier (LCC) type electronic component 200 including LCC-type outer connection portions 51 and 52 that are provided from side surfaces of a base substrate 53 to a lower surface (back surface) of the base substrate 53 is used. The outer connection portions 51 are provided at the back surface of the base substrate 53 for heat dissipation and supporting of the electronic component 200. The outer connection portions 51 are connected to a module board 45, which differs from the module board 100, with solders 311. The module board 45 functions as a supporting board and/or a heat-dissipating board, and need not function electrically. The module board 45 corresponds to the first member 1 or the second member 2. The module board 45 is formed of a metal, and the entire surface of the module board 45 can join with solder. The outer connection portions 52 are connected to the module board 100 with solders 331. The module board 100 is a module board that functions electrically, such as a printed wiring board.

Figure 6B:
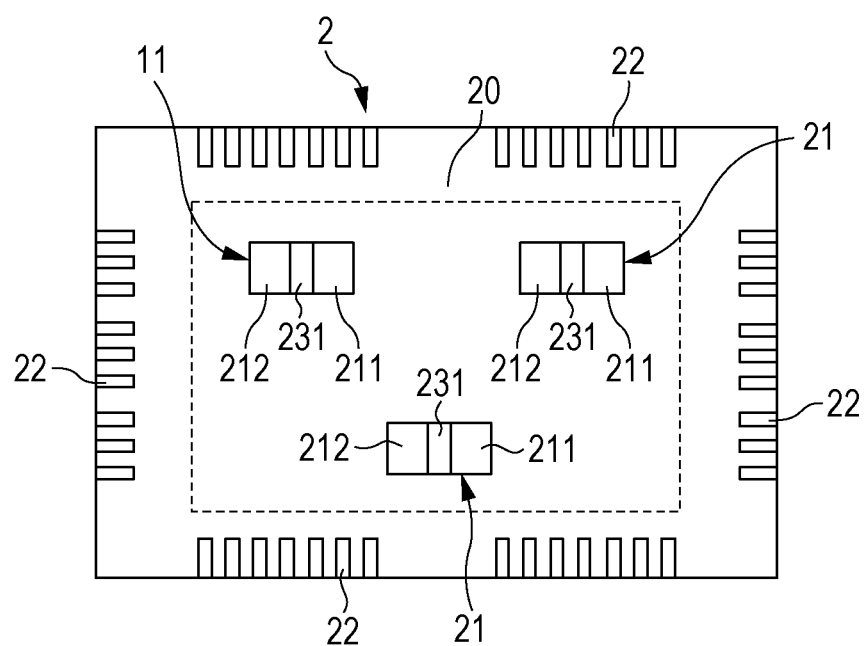

FIG. 6B is an example of a layout of a joining surface of the electronic component 200 including the outer connection portions 51 and 52. As shown in FIG. 6B, in the example, separation portions 231 are provided at electrically conductive films 21 corresponding to the outer connection portions 51 of the electronic component 200. Therefore, each single electrically conductive film 21 includes a land 211 and a land 212 that are separately provided. Each outer connection portion 51 including separate lands 211 and 212 is soldered to the board 45, serving as a single land, with the corresponding solder 311. The solders 311 formed by the soldering are obtained by melting solder pastes applied to a plurality of portions of the module board 45 and joining molten solders to each other by a reflow method. As in the second embodiment, separation portions may be provided at the board 45 or solder pastes may be applied to the electronic component 200. Such a method makes it possible for the molten solders to spread over the surface of the module board 45 and increase the joining area. Therefore, it is possible to increase the soldering joining strength between the electronic component 200 and the module board 45.

Example

The module board 100 shown in FIG. 1 was used as the first member 1 shown in FIGS. 2A to 2E and FIGS. 5A, 5B, and 5C; and the electronic component 200 shown in FIG. 1 was used as the second member 2.

First, the structure of the module board 100 used as the first member 1 is described with reference to FIG. 1. The module board 100 includes a base substrate 40 formed of glass epoxy having a thermal expansion coefficient of 15 ppm/° C. The module board 100 also includes connection portions 41 and 42 having a layered structure in which a copper layer, a nickel layer, and a gold layer were placed upon each other in that order from the side of the base substrate 40. The base substrate 40 corresponds to the base substrate 10 in FIGS. 2A to 2E. The connection portion 41 corresponds to the electrically conductive film 11, and the connection portion 42 corresponds to the electrically conductive film 12. As an insulating film 13, a solder resist formed of resin was used. By this, a land pattern shown in FIG. 5A was obtained.

Next, the structure of the electronic component 200 is described with reference to FIG. 1. As a base substrate 53, an alumina ceramic material having a thermal expansion coefficient of 7 ppm/° C. was used. A package 50 including inner connection portions 55 (serving as connection portions for wire bonding), an internal wire 54, and outer connection portions 51 and 52 at a bottom surface was formed.

More specifically, first, with these being used as precursors for the base substrate 53, a tungsten paste was printed on a surface of a green sheet, and was baked at a temperature of from 1300 to 1600° C., so that tungsten layers for the outer connection portions 51 and 52 and the inner connection portions 55 were formed. The size of the base substrate 53 was 25 mm (height)×35 mm (length)×0.8 mm (thickness). Next, nickel layers were formed on the tungsten layers for the outer connection portions 51 and 52 and the inner connection portions 55 by electrolytic nickel plating. Then, by electrolytic gold plating, gold layers having a thickness of 0.5 μm were formed on the nickel layers for the outer connection portions 51 and 52 and the inner connection portions 55. By this, the outer connection portions 51 and 52 each having a layered structure in which the tungsten layer, the nickel layer, and the gold layer were placed upon each other in that order from the side of the base substrate 53 were formed. The base substrate 53 corresponds to the base substrate 20 of the second member 2 in FIGS. 2A to 2E. The outer connection portion 51 corresponds to an electrically conductive film 21, and the outer connection portion 52 corresponds to an electrically conductive film 22. An alumina film, serving as an insulating film 23, was formed on a back surface of the package 50. By this, a land pattern shown in FIG. 5B was formed. The width of each separation portion 231 of the alumina film, positioned on its corresponding electrically conductive film 21, was 0.3 mm.

Further, an electronic device 57, serving as a CMOS image sensor, was bonded to the base substrate 53 with a die bonding paste (not shown). A pad for connecting the electronic device 57 and the inner connection portions 55 were connected to each other with bonding wires serving as connection members 56. Further, a glass plate serving as a sealing member 58 was bonded to an upper portion of the base substrate 53 with an adhesive (not shown). In this way, the electronic component 200 serving as the second member 2 was formed. Electrical characteristic inspection was carried out with a probe pin being in contact with the outer connection portion 52 connected to the electronic device 57 through the connection member 56.

As shown in FIG. 2B, solder pastes 31, 32, and 33 were applied to the electrically conductive films 11 and 12 of the first member 1 (module board 100) by screen printing. At this time, as shown in FIG. 5C, a pattern of the solder pastes on the electrically conductive films 11 and 12 was formed so as to be substantially the same as a pattern of lands of the opposing electronic component 200.

By aligning the first member 1, serving as the module board 100, and the second member 2, serving as the electronic component 200, lands 110 were superposed upon lands 211 and 212, and, similarly, lands 120 and lands 220 were superposed upon each other.

Then, the solder pastes were heated and melted (underwent reflow), so that the lands 211 and 212 of the second member 2 were joined to the lands 110 of the first member 1 with solders 311, and the lands 220 of the second member 2 were joined to the lands 120 of the first member 1 with solders 331, the solders 311 and 331 having a thickness of 0.2 mm. As the solders 311 and 331, leadless solders having a melting point of 165° C. and based on tin-bismuth (Sn—Bi) were used.

Ten modules 300 were formed. The ten modules 300 were subjected to 1000 cycles of a temperature cycle test, with a step for retaining a test sample for 10 minutes each in a constant temperature bath controlled to a temperature of −25° C. and 125° C. being defined as one cycle. Electrical resistances between the module boards 100 and the electronic components 200 before and after the tests were measured. Soldering joining states before and after the tests of the modules 300 were observed with an X-ray inspection device. No changes were observed in the electrical resistances after 1000 cycles in any of the ten modules 300 according to the example. In addition, no abnormalities, such as cracks or breakages, were observed at solder joints before and after the tests.

Reference Example 5

Ten comparative modules 10 were formed in the same way as in the example except that a pattern was formed into one corresponding to the pattern of application of solder pastes on the lands 110 of the first member 1 according to the example except that the pattern was not divided as in FIG. 5D.

Electrical resistances were evaluated by carrying out temperature cycle tests, which were the same as those according to the example, on the ten comparative modules. Solder joint states were observed with an X-ray inspection device.

It was found that, after the temperature cycle tests, there were cases in which solder joints between the outer connection portions 51 of the electronic components 200 and the connection portions 41 of the module boards 100 were broken. This resulted in the tendency of electrical resistances at solder joint portions near the broken solder joints to be increased. As a result of the observations using the X-ray inspection device, it was inferred that a lack of soldering joining strength due to solder not being spread up to the end portions of the lands 110 was a cause of the broken solder joints. In addition, very small cracks were observed near the solder joints having increased electrical resistance. It was inferred that, as solder joints at the lands 110 having a larger area than the lands 120 were broken, an increase in stress on surrounding solder joints caused cracks.

From the foregoing results, according to the method for mounting an electronic component according to the example, it is possible to cause solder to spread over lands, in particular, entire solder joint reinforcing lands having large areas whose influence on soldering joining strength is large. Therefore, it is possible to provide a module in which breakage of solder joints caused by thermal stress in, for example, a temperature cycle does not occur by increasing the reliability with which electrode connection portions of the electronic component and a printed wiring board are joined to each other.

The above-described embodiments may be modified or combined as appropriate within a range that does not depart from the idea of the present disclosure. Well-known or publicly known technologies of the technical field may be applied to portions that are not, in particular, illustrated or described in the present specification.

According to a method for producing a module according to the present invention, it is possible to increase soldering joining strength.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-159755, filed Aug. 5, 2014, which is hereby incorporated by reference herein in its entirety.

What is claimed is:

1. A method for producing a module including a first member and a second member that are soldered to each other, the method comprising:

an applying step of applying solder pastes to a first portion and a second portion of the first member;

a contacting step of bringing a first portion of the second member and the solder paste applied to the first portion of the first member into contact with each other, and bringing a second portion of the second member and the solder paste applied to the second portion of the first member into contact with other; and a melting step of causing the solder paste brought into contact with the first portion of the second member and the solder paste brought into contact with the second portion of the second member to melt, wherein the first and second portions of one of the first member and the second member are located on a single land, and the first and second portions of other of the first member and the second member are located on different lands, wherein, in the applying step, the solder paste applied to the first portion of the first member and the solder paste applied to the second portion of the first member are separated from each other, and wherein, in the melting step, molten solder which is formed by melting the solder paste in contact with the first portion of the second member and molten solder which is formed by melting the solder paste in contact with the second portion of the second member are joined to each other.

2. The method according to claim 1, wherein a single electrically conductive film includes the different lands, and an insulating film contacts a part of the single electrically conductive film between the different lands.

3. The method according to claim 2, wherein a width of the insulating film that defines the different lands is from 0.5 to 2.5 times a thickness of a solder layer that achieves the soldering.

4. The method according to claim 2, wherein the insulating film is an inorganic material film.

5. The method according to claim 1, wherein a melting point of solder included in each of the solder pastes is less than or equal to 170° C.

6. The method according to claim 1, wherein, in the applying step, a solder paste is applied to a third portion of the first member, wherein, in the contacting step, a third portion of the second member and the solder paste applied to the third portion of the first member are brought into contact with each other, wherein, in the melting step, the solder paste brought into contact with the third portion of the second member is melted, wherein, in the applying step, the solder paste applied to the third portion of the first member is separated from the solder paste applied to the first portion of the first member and the solder paste applied to the second portion of the first member, and wherein, in the melting step, molten solder formed by melting the solder paste brought into contact with the third portion of the second member is not joined to molten solder formed by melting a solder paste brought into contact with a portion that differs from the third portion of the second member.

7. The method according to claim 6, wherein at least one of the third portion of the first member and the third portion of the second member is located on a land having an area than is smaller than an area of the single land.

8. The method according to claim 6, wherein the second member includes an electronic device, wherein the first portion and the second portion of the second member are not electrically connected to the electronic device, and wherein the third portion of the second member is electrically connected to the electronic device.

9. The method according to claim 1, wherein the first member is a module board, the first member includes the different lands, the second member is an electronic component, and the second member includes the single land.

10. The method according to claim 1, wherein the second member includes a package and an image pickup device, the package including the different lands, the image pickup device being electrically connected to the package.

11. A method for producing a module including a first member and a second member that are soldered to each other, the method comprising:
providing a first member having first electrically conductive films and second electrically conductive films, each area of the second electrically conductive films being smaller than each area of the first electrically conductive films;
an applying step of applying solder paste to a first portion and a second portion which are included in each of the first electrically conductive films, and applying solder paste to a third portion which is included in each of the second electrically conductive films;
a contacting step of bringing the second member and the solder paste applied to the first member into contact with each other; and
a melting step of causing the solder paste brought into contact with the second member to melt,
wherein, in the applying step, the solder paste applied to the first portion of the first member and the solder paste applied to the second portion of the first member are separated from each other, and the solder paste applied to the third portion of the first member is separated from the solder paste applied to the first portion of the first member and the solder paste applied to the second portion of the first member, and
wherein, in the melting step, molten solder formed by melting the solder paste applied to the first portion of the first member and molten solder formed by melting the solder paste applied to the second portion of the first member are joined to each other, and molten solder formed by melting the solder paste applied to the third portion of the first member is not joined to any molten solder formed by melting a solder paste applied to the first member.

12. The method according to claim 11, wherein the first portion of the first member and the second portion of the first member are located on different lands, and a single electrically conductive film of the first electrically conductive films includes the different lands, and an insulating film contacts a part of the single electrically conductive film between the different lands.

13. The method according to claim 12, wherein a width of the insulating film that defines the different lands is from 0.5 to 2.5 times a thickness of a solder layer formed by the soldering.

14. The method according to claim 11, wherein in the contacting step, a first portion of the second member and the solder paste applied to the first portion of the first member contacts with each other, and a second portion of the second member and the solder paste applied to the second portion of the first member contacts with each other, a single electrically conductive film includes the first portion of the second member and the second portion of the second member.

15. The method according to claim 11, wherein a melting point of solder included in each of the solder pastes is less than or equal to 170° C.

16. The method according to claim 11, wherein a number of the first electrically conductive films is smaller than a number of the second electrically conductive films.

17. The method according to claim 11, wherein the first electrically conductive films and the second electrically conductive films are provided on a surface of the first member, each of the first electrically conductive films is arranged closer to a corner of the surface than each of the second electrically conductive films is arranged.

18. The method according to claim 11, wherein the second member includes an electronic device,
wherein the first electrically conductive films are not electrically connected to the electronic device, and
wherein the second electrically conductive films are electrically connected to the electronic device.

19. The method according to claim 11, wherein the first member is a module board, and the second member is an electronic component which includes a ceramic substrate.

20. The method according to claim 11, wherein the second member includes a package and an image pickup device electrically connected to the package.

* * * * *